United States Patent [19]

Petroz

[11] Patent Number: 5,174,188
[45] Date of Patent: Dec. 29, 1992

[54] PROCESS AND DEVICE FOR MARKING AND CLEAVING PLAQUETTES OF MONOCRYSTALLINE SEMICONDUCTOR MATERIALS

[75] Inventor: Gérard Petroz, St. Martin, France

[73] Assignee: Commissariat a l'Energie Atomique, Paris, France

[21] Appl. No.: 533,292

[22] Filed: Jun. 5, 1990

[30] Foreign Application Priority Data

Jun. 7, 1989 [FR] France .................. 89 07537

[51] Int. Cl.⁵ .................. C03B 33/03; B26D 3/08
[52] U.S. Cl. .................. 83/882; 83/879; 83/880; 83/521; 225/96
[58] Field of Search .......... 83/879, 880, 882, 521; 225/2, 96, 96.5, 103; 125/23.01; 33/32.1, 32.3, 32.5, 32.6, 32.7

[56] References Cited

U.S. PATENT DOCUMENTS

| | | | |
|---|---|---|---|
| 3,222,963 | 12/1965 | Nabiullin et al. | 83/882 |
| 3,230,625 | 1/1966 | Meyer | 125/23.01 |
| 3,326,071 | 6/1967 | Bushman et al. | 83/880 |
| 3,545,325 | 12/1970 | Camasta | 83/882 |
| 4,046,985 | 9/1977 | Gates | 275/2 |
| 4,117,751 | 10/1978 | Inoue | 83/879 |

FOREIGN PATENT DOCUMENTS 1566090  5/1969  France .
2046933  3/1971  France .

OTHER PUBLICATIONS

IDA I., et al., Ultramicroscratching on Worked GaAs Surface, Rev. Elect. Comm. Lab., vol. 17, No. 9, Sep. 1969, pp. 1037–1055.

Primary Examiner—Hien H. Phan
Attorney, Agent, or Firm—Michael N. Meller

[57] ABSTRACT

A process and device for marking and cleaving plaquettes of monocrystalline semiconducting materials is described. According to invention, in order to mark off a reference direction onto a plaquette of a monocrystalline semiconducting material having a low hardness, an impression (1) is formed on the useful face of the plaquette and in a non useful area of that face, the impression bringing into view at least one direction from which the reference direction (9, 11, 13) is deduced, and the latter is marked off by means of a line on the non useful area. Since the reference direction corresponds to a cleavage plane of the plaquette, the latter, in addition, is cleaved by tracing a cleavage line along the reference direction on the other face of the plaquette.

8 Claims, 5 Drawing Sheets

PROCESS AND DEVICE FOR MARKING AND CLEAVING PLAQUETTES OF MONOCRYSTALLINE SEMICONDUCTOR MATERIALS

DESCRIPTION

This invention relates to a process and device for marking and cleaving plaquettes of monocrystalline semiconductor materials.

It applies, in particular, to the marking of reference directions on plaquettes of monocrystalline semiconducting materials having a low hardness as well as to the cleavage of such plaquettes.

By "low hardness", is meant a hardness which is equal at most to 500 KNOOP units and by "high hardness", is meant a hardness greater than 500 KNOOP units.

A technique is already known for cleaving monocrystalline plaquettes. According to this technique, in order to cleave such a monocrystalline plaquette, a line is first traced by means of an appropriate diamond onto the active face, or head face, of the plaquette. This face is the one on which semiconducting components are formed. The line may be continuous or discontinuous. After having traced this line, a deformation process is started which makes it possible to break the plaquette in two along the line traced thereon. To this effect, the plaquette is placed on a soft support and a roller is passed over the plaquette while applying a pressure which is sufficient to produce fracture. It should be noted that the cleavage of monocrystalline plaquettes presupposes the precise locating of the cleavage planes. It is known that monocrystalline silicon plaquettes are provided with one or two flat parts for this purpose.

This known cleavage technique was developed essentially for materials such as silicon and gallium arsenide. i.e., materials of high hardness. Cleaving machines are indeed commercially available and, in certain cases, replace conventional diamond saw cutting machines.

It should be noted that cutting paths, or cleavage paths, which are untreated areas, i.e., comprising no semiconducting components whatsoever, are provided on the plaquettes for the purpose of tracing, on each path, a line providing for a cleavage, so as to prevent any damage to the semiconducting components formed on the plaquette. The width of these paths is of the order of 100 micrometers which leads to a loss of space on the plaquettes.

Furthermore, the conventional cleavage technique which consists in tracing a line on a plaquette and then cleaving it using a method of deformation on a soft support in order to produce the cleavage is not suitable for semiconducting materials of low hardness due to degradations in the crystalline network induced by that deformation.

The object of the invention is to correct the preceding drawbacks by proposing a process and device making it possible to mark off reference directions on plaquettes of microcrystalline semiconductor materials having a low hardness and to cleave such plaquettes with great precision, thus allowing the provision on said plaquettes of cleavage paths, or areas, the width of which is substantially less than 100 micrometers and perhaps of the order, for example, of 10 micrometers.

Specifically, this invention relates, first of all, to a process for marking off a reference direction onto a plaquette of microcrystalline semiconductor material having a low hardness and for cleaving that plaquette, which process comprises the following steps:

an impression is formed on the face, termed head face, of the plaquette, on which face semiconducting components are, or subsequently will be, formed and on an area, termed non useful area, of that head face, which area does not carry, or will not subsequently carry, any semiconductor components, the impression bringing into view, on that non useful area, at least one direction from which the reference direction is deduced, this reference direction is marked off by means of a line on the non useful area, and since the reference direction corresponds to a direction along which the plaquette can be cleaved, the latter is cleaved by tracing a cleavage line along the reference direction, onto the other face, termed rear face, of the plaquette and in an area of that rear face located below the non useful area so as to cleave the plaquette in that non useful area provided for this purpose.

Indeed, cleavage of the plaquette may be considered by tracing a cleavage line along the reference direction, in the non useful area, provided for this purpose.

However, the tracing of a line on the plaquette induces very substantial strains in the material of which it is made and these strains, which are localized, give rise to the separation of the plaquette into two parts. In the immediate environment, the crystalline network is disturbed, in particular, in low hardness monocrystalline materials.

It can be seen, therefore, that the tracing of the cleavage line, not on the useful face, or head face, of the plaquette but on the opposite face, or rear face reduces to a minimum the disturbances in the crystalline network on the side of the head face of the plaquette on which are located the semiconducting components, since this disturbance occurs on the side of the rear face and therefore as far as possible from the head face. This makes it possible to provide cleavage paths, or areas, having a small width (of less than 100 micrometers, for example, 10 micrometers) on the head face of the plaquette.

The invention applies to plaquettes made of microcrystalline materials chosen from the groups comprising CdTe, CdHgTe, Inp, InSb, AlGaAs and more generally of low hardness monocrystalline semiconducting materials belonging to groups II-VI and III-V.

The direction brought into view by formation of the impression can be parallel to sliding planes of the material, this material having cleavage planes which are perpendicular to these sliding planes, the reference direction chosen then being perpendicular to the direction brought into view as a result of the formation of the impression.

The impression can be of the type of those used for microhardness tests of materials.

This invention also relates to a device for marking off a reference direction onto a plaquette of a microcrystalline semiconducting material having a low hardness and for cleaving that plaquette, which device comprises means, for the formation of an impression and for tracing, provided for the formation of an impression on the face, termed head face, of the plaquette, on which face semiconducting components are, or will subsequently be formed. In an area termed non useful area of this head face, which area does not carry, or will not subsequently carry, any of these components, the impression bringing into view, on this non useful area, at least one direction from which the reference direction is deduced, and for the tracing, on the non useful area, of a line designed to mark off this reference direction, and in that, taking into account the fact that the reference direction corresponds to a direction along which the plaquette can be cleaved, the device comprises, in addition, means which are capable of tracing a cleavage line along the reference direction, on the rear face of the plaquette and in an area of this rear face which is located below the non useful area, so as to cleave the plaquette in that non useful area, provided for this purpose.

The impression formation and tracing means can comprise:
- means designed to support the plaquette, the latter resting on these means of support through its other face, termed rear face, these support means being mobile in translation along a first axis and a second axis perpendicular to the first, said support means being, in addition, mobile in rotation around a third axis which is perpendicular to the first and second axes and mobile in translation in a direction parallel to this third axis,
- means for maintaining the plaquette on the support means,
- means for the microscopic observation of the head face of the plaquette along a sighting axis which is parallel to the third axis and is provided with means for locating the first and second axes, these means of observation comprising at least one optical microscopic observation device, and
- a member capable of forming the impression and of tracing the line when the support means are moved in translation along either one of the first and second axes.

The support means can comprise a first support mobile in translation along the first, second and third axes and a second support which is mobile in rotation around the third axis which is mounted on the first support and carries the means for maintaining the plaquette.

The member capable of forming the impression and of tracing the line can be made integral with the optical observation device, the assembly formed by this member and this optical device being mobile in a way such that the optical observation device and the member can alternately be placed along the sighting axis.

The means designed to trace a cleavage line can comprise a tracing member located below the support means which is mobile in translation in a direction parallel to the first, second and third axes, the support means comprising a bored hole providing for the passage of the tracing member and the means for maintaining the plaquette being capable of preventing the lifting thereof when the tracing member is pressed against it.

The sighting axis can, in addition, be provided with means for locating at least one cleavage direction.

Finally, for reasons of pressure homogeneity, the member capable of forming the impression and of tracing the line is preferably provided so as to give rise to a spherically shaped impact on the plaquette.

It is seen, therefore, that this invention makes it possible, by means of one and the same device, to locate crystallographic directions, to mark off reference directions for the purpose of a subsequent treatment of plaquettes of low hardness microcrystalline semiconducting materials and to cleave such plaquettes. As will be seen subsequently, the device according to the invention, provided with means capable of tracing a cleavage line on the rear face of the plaquette, also makes it possible to cleave microcrystalline semiconducting materials having a high hardness such as Si and AsGa.

This invention will be more fully understood in the light of the following description of examples of embodiments given merely as illustrations or which are in no way limiting with reference to the appended drawings wherein:

FIG. 11 is a composite perspective drawing of FIGS. 1 and 8.

A description will now be given below of a particular embodiment of the device according to the invention. It is specified that this device can be obtained using a conventional optical microscope operating with transmitted light, suitably modified, or more generally, from any microscopic observation system provided with translational-rotational means.

In accordance with the process according to the invention, in order to mark off a reference direction onto a plaquette of a monocrystalline semiconducting material having a low hardness, an impression is first formed on the head face of the plaquette and in a non useful area of that head face. This impression is of the type of those which are used in microhardness tests and gives rise to a deformation of the surrounding lattice, which deformation reveals crystallographic planes or cleavage microprimers, from which a reference direction on the plaquette can be determined, as will be seen subsequently.

Figures 1A, 1B, 3, 4:
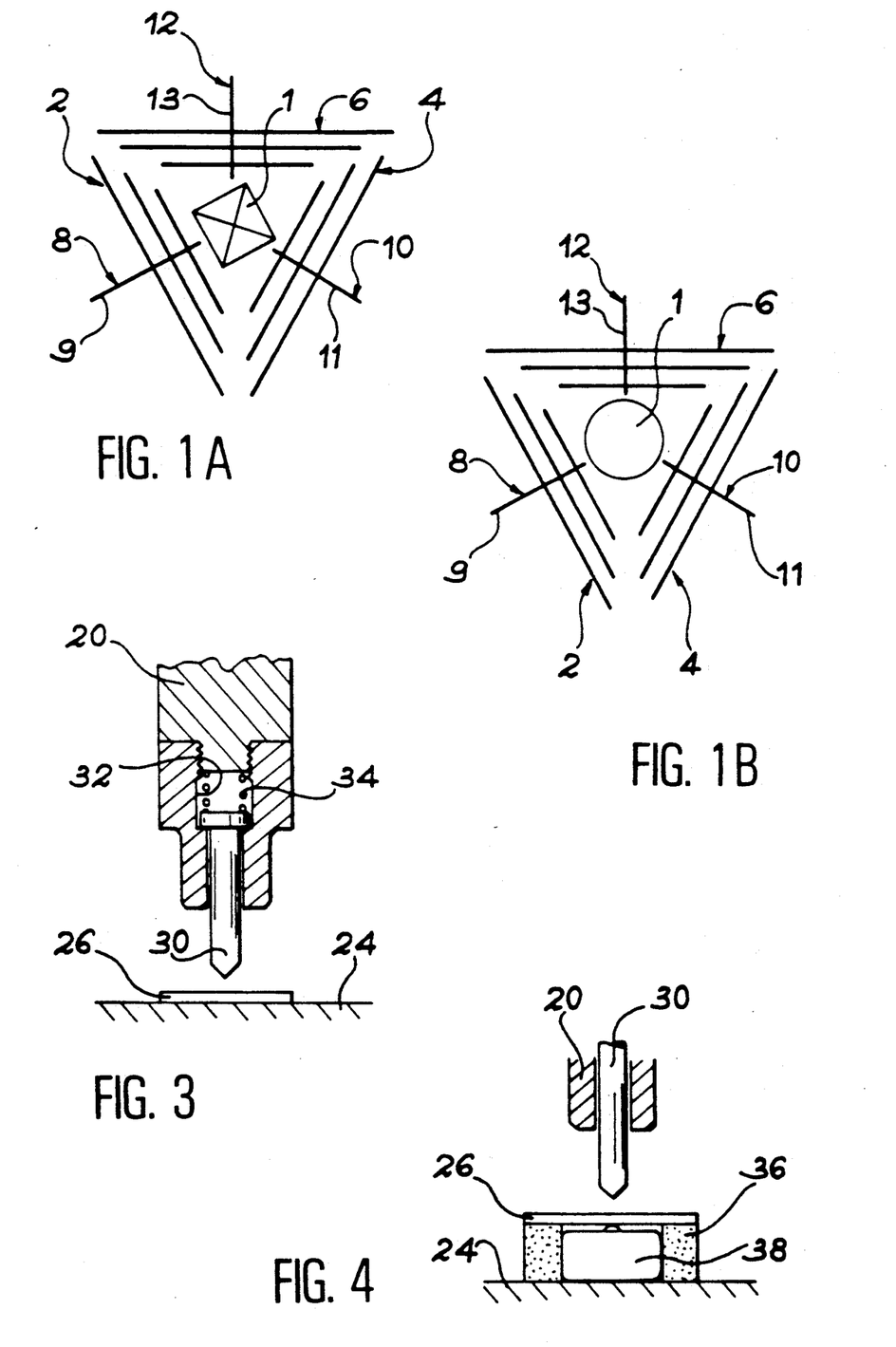
FIGS. 1A and 1B illustrate diagrammatically impressions obtained in accordance with the invention which are of the type of those used in microhardness tests respectively of the VICKERS and ROCKWELL types.
FIGS. 3 and 4 are diagrammatic views of examples of embodiments of a marking member which can be used in the device shown in FIG. 2.

FIGS. 1A and 1B illustrate such impressions 1. In these figures, these impressions 1 are assumed to be formed in materials of the CdHgTe or CdTe-111 type. The formation of an impression brings into view on the surface of the plaquette, groups of sliding planes of the 110 type. These groups are identified by the reference numbers 2, 4, 6 in FIGS. 1A and 1B. Each plane of a group forms an angle of 60° with a plane of another group. A reference direction which is to be marked off on the plaquette is the tracing, on the surface of the latter, of a cleavage plane. The cleavage planes of the 110 type are perpendicular to the surface of the plaquette and are also perpendicular to the planes which have slid near the impact thus creating the impression. These planes which have slid, of the 110 type, are at approximately 35° from the surface of the plaquette. FIGS. 1A and 1B show cleavage planes which are identified by reference numbers 8, 10, 12 and which are respectively perpendicular to plane groups 2, 4, 6. The reference directions, identified by reference numbers 9, 11, 13, are respectively parallel to planes 8, 10, 12 and, in the examples of FIGS. 1A and 1B, pass through the center of the impression.

To form an impression, a diamond point having a pyramidal or conical shape can be used such as those employed in the tests of the VICKERS type (FIG. 1A) but, for reasons of pressure homogeneity, it is preferable to use a diamond point having a spherical shape such as those employed in tests of the ROCKWELL type (FIG. 1B).

Figure 2:
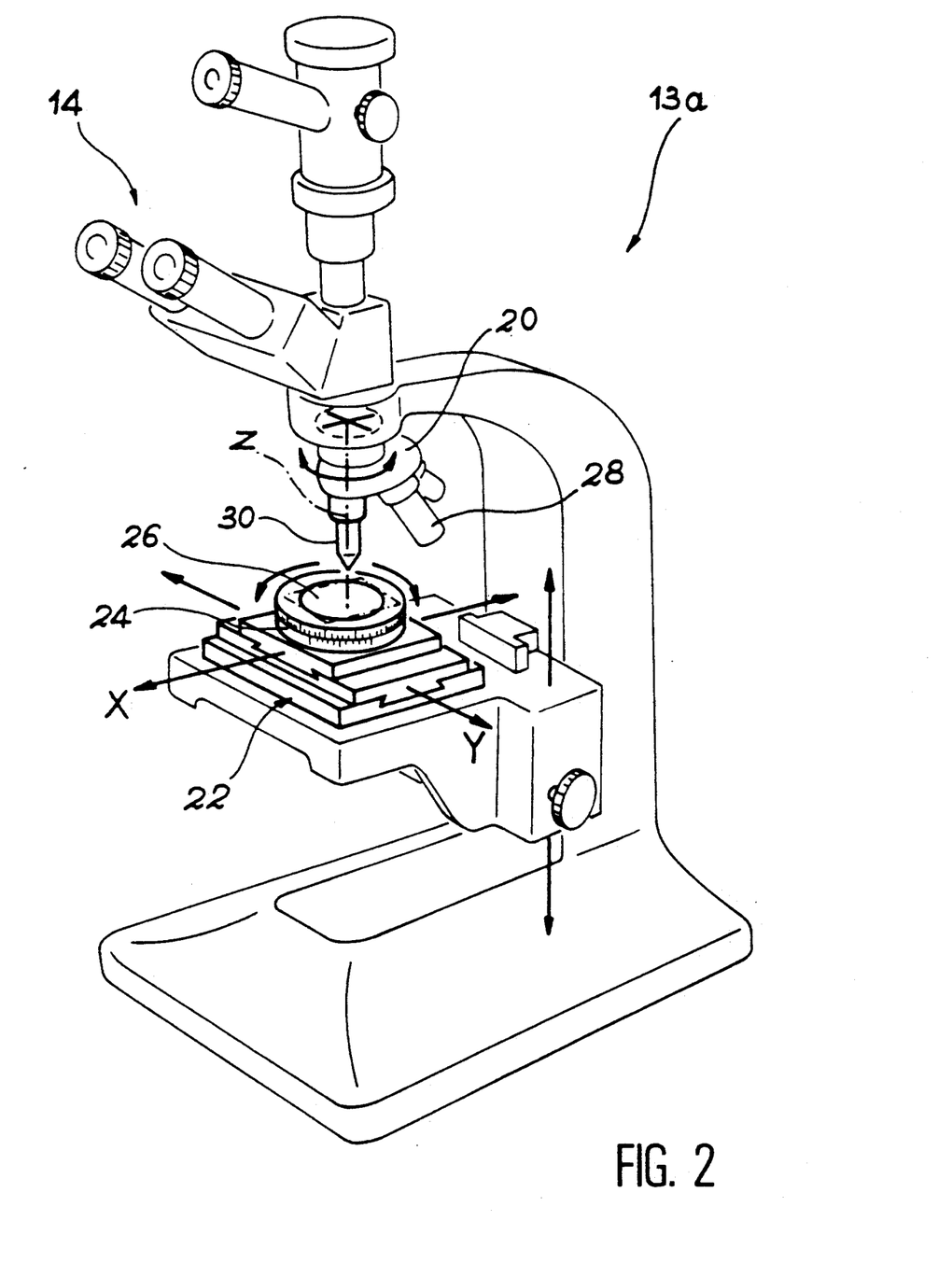
FIG. 2 is a diagrammatic view of a device which can be used in the invention.

The device usable in the invention, which is shown diagrammatically in FIG. 2, comprises a conventional optical microscope 13a. This microscope includes at least one ocular 14 provided with a cross-shaped reticle 16 (see FIG. 5) the two branches of which respectively define perpendicular axes X and Y. The microscope comprises a sighting axis Z which is perpendicular to axes X and Y and which passes through the center of the reticle. The microscope comprises, in addition, a support assembly 22, more simply termed stage 22 in the following description and which is movable in translation along axes X, Y and Z and is located below turret 20 of the microscope. In the application of the invention, a platen 24 is added to microscope 13a which platen is mounted on platen 22 and is movable in rotation on the latter, around an axis T (see FIG. 7) which is parallel to axis Z. It is on this platen 24 that a plaquette 26 is attached which is to be marked off according to the invention.

Furthermore, the turret 20 normally carries several magnification objectives 28. However, as regards the application of the invention, one of these objectives is replaced by a diamond point 30 which acts to form the impression on the plaquette. The remaining objectives 28 have different magnifications, for example ×5, ×10, ×20 and ×50 respectively. Turret 20 is mobile in rotation such that it is possible to bring, at will, one of the objectives or the diamond point within the sighting axis Z, the optical axis of this objective or the axis of the diamond point then coinciding with this sighting axis Z.

Moreover, as can be seen in FIG. 3, the turret is modified so as to permit a translation of the diamond point 30 in a direction parallel to the sighting axis Z when this diamond point is placed along this sighting axis Z. To this effect, an appropriate housing 32 is provided in turret 20 and diamond point 30 is mobile in translation in this housing 32. As will be seen subsequently, a specified pressure is exerted by means of diamond point 30 on the plaquette. For this purpose, an appropriate spring 34 is placed in housing 32 which spring presses on one side against the bottom of housing 32 and on the other against the extremity of point 30 opposite that which bears the diamond. As can be seen in FIG. 3, the housing 32 comprises an internal shoulder against which said extremity presses, the latter being wider than the rest of the point 30. A calibrated pressure can thus be exerted. In a varying embodiment, not shown, the pressure is controlled by means of a force trap.

In another varying embodiment, illustrated diagrammatically in FIG. 4, diamond point 30 remains fixed with respect to turret 20 and plaquette 26 is mounted on platen 24 by means of an elastic support 36 and the pressure exerted by diamond point 30 is controlled by a force trap 38 which is placed between plaquette 26 and platen 24.

To this effect, elastic support 36 can comprise a bored hole, force trap 38 being placed on platen 24 inside this bored hole and that part of trap 38 which is sensitive to the force being of course in contact with plaquette 26.

Means, not shown, are of course provided, when a force trap is used, in order to warn the user of the device that the pressure not to be exceeded has been reached.

The way in which the impression is formed in the plaquette will now be explained. As this plaquette is set into place and maintained on platen 24, the rear face of the plaquette being turned towards the latter, the head face of this plaquette is observed by means of an appropriate objective 28 of turret 20 and stage 22 is moved by means of appropriate translations along axes X and Y so as to observe, along axis Z, a non useful area of the head face of plaquette 26 in which the impression is to be formed. Turret 20 is then turned so as to place diamond point 30 along axis Z and stage 22 is moved in translation along axis Z so as to cause plaquette 26 to be raised until the required impression is formed.

Figure 5:
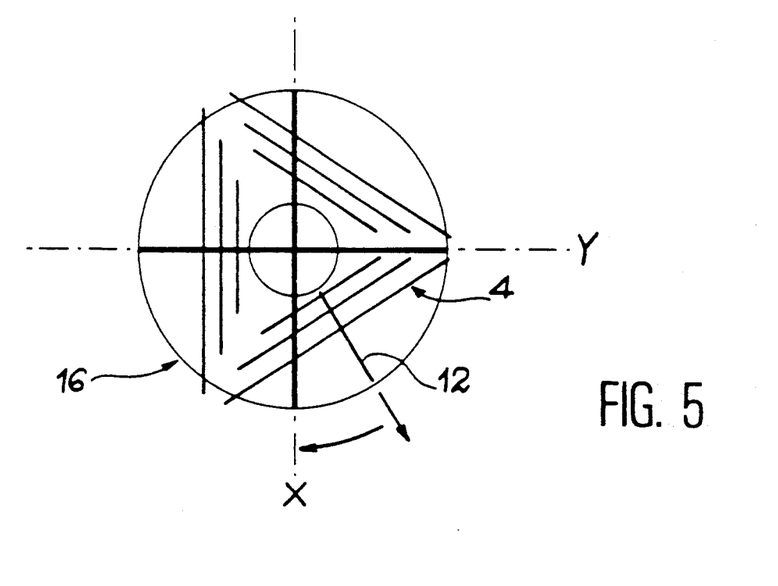
FIG. 5 illustrates diagrammatically a step in the marking process in accordance with the invention applied to the device shown in FIG. 2.

An impression is then obtained which is, for example, of the type of that shown in FIG. 1A or FIG. 1B. It is then possible to mark off a reference direction (of the type relating to directions 9, 11, 13) on the non useful area of the plaquette, provided to this effect. For this purpose, stage 22 is lowered, the turret is turned in order to reset into place objective 28 along sighting axis Z and, assuming that the non useful area is a path parallel to axis X (located by reticle 16), platen 24 is rotated so as to make the planes of one of the groups 2, 4 6 parallel to axis Y (located by reticle 16) so that the cleavage planes are parallel to axis X and the reference direction chosen, for example, direction 13 corresponding to cleavage plane 12, comes to coincide with axis X of reticle 16, this direction being the mediatrix common to the segments materializing the corresponding sliding planes 4. Diamond point 30 is then used to mark off the reference direction. To this effect, the diamond point 30 is set back into place along sighting axis Z by rotation of turret 20, stage 22 is lifted back to its previous position and a translation of stage 22, and therefore of plaquette 26, is effected along axis X. The reference direction is thus marked off by a line in the non useful area.

This reference direction can be used as a mask positioning reference or to cleave the plaquette on the head face thereof, along the direction thus marked off. To this effect diamond point 30 is used again to trace a cleavage line along the reference direction marked off, by moving again stage 22 in translation along axis X which leads to the separation of plaquette 26 into two parts.

As already indicated, a cleavage of the plaquette on the head face thereof requires the provision of cutting paths of substantial width as a result of the disturbance induced by the cleavage on the face of the plaquette carrying semiconducting components. For this reason, in accordance with the invention, the plaquette is cleaved through the latter's rear face. To this effect, the microscope used is provided with additional means which will be described. It is indicated that the cleavage can be obtained by tracing a continuous or discontinuous line on the rear face of the plaquette in a direction parallel to the cleavage planes and in an appropriate area of this rear face. The cleavage tool can comprise a cutting diamond by way of indication which is in no way limiting. The value of such a diamond resides in the quality of its edge, its hardness and resistance to wear.

Figure 6:
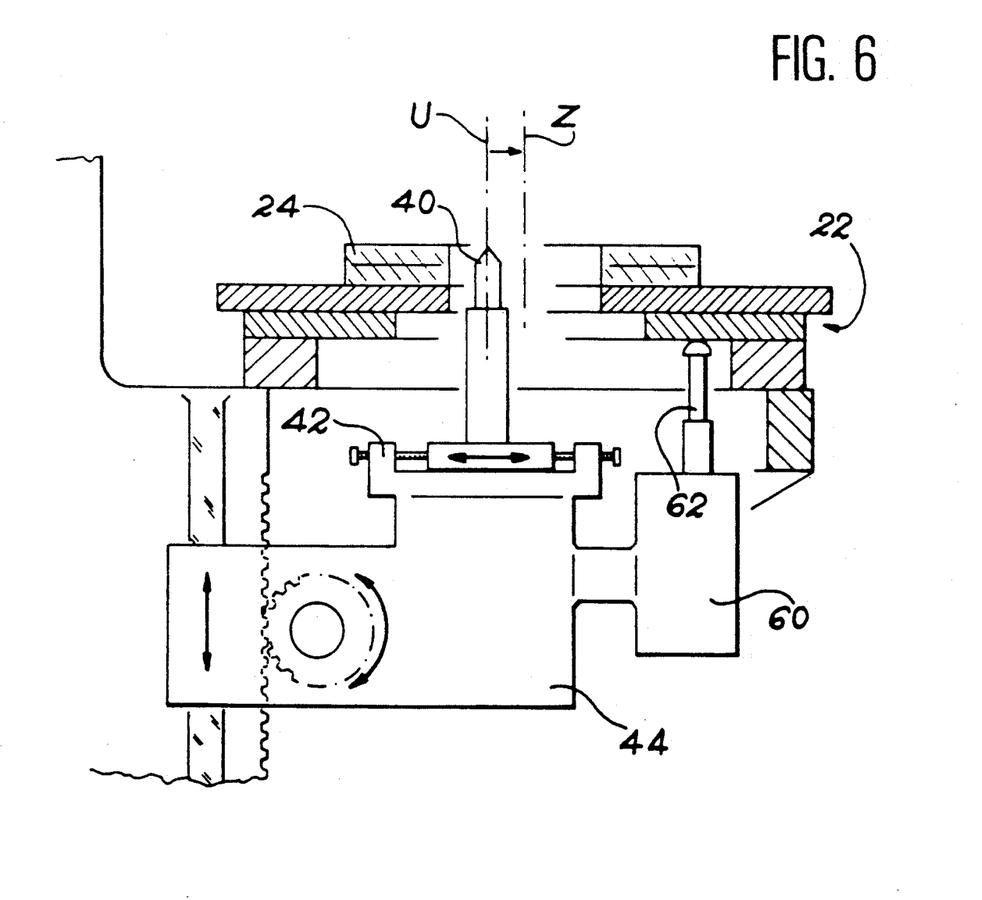
FIG. 6 is a diagrammatic view of cleavage means provided in the device shown in FIG. 2, for the application of the invention.

In order to cleave the plaquette by its rear face, the microscope of the device shown in FIG. 2 is thus provided with a cutting diamond point 40 (FIG. 6) axis U of which is parallel to axis Z and which is located below stage 22. This diamond point 40 is mounted on a first platen 42 which provides for the motion of point 40 in translation along axes X and Y. This platen 42 is itself mounted on another platen 44 which can be moved in translation in a direction parallel to axis Z. Furthermore, the assembly of platens 22 and 24 comprises a central bored hole the axis of which is parallel to axis Z and the size of which (the diameter in the case of a circular bored hole) is sufficient to allow the passage of the diamond point 40 and allow motions of the point 40 along axes X and Y for the purpose of suitably positioning this point 40 and tracing the cleavage line.

Platen 24 used in the device shown in FIG. 2 can rotate 360° on itself and comprises a fine adjustment which uses a precision vernier of 1 minute of an angle.

Figure 7:
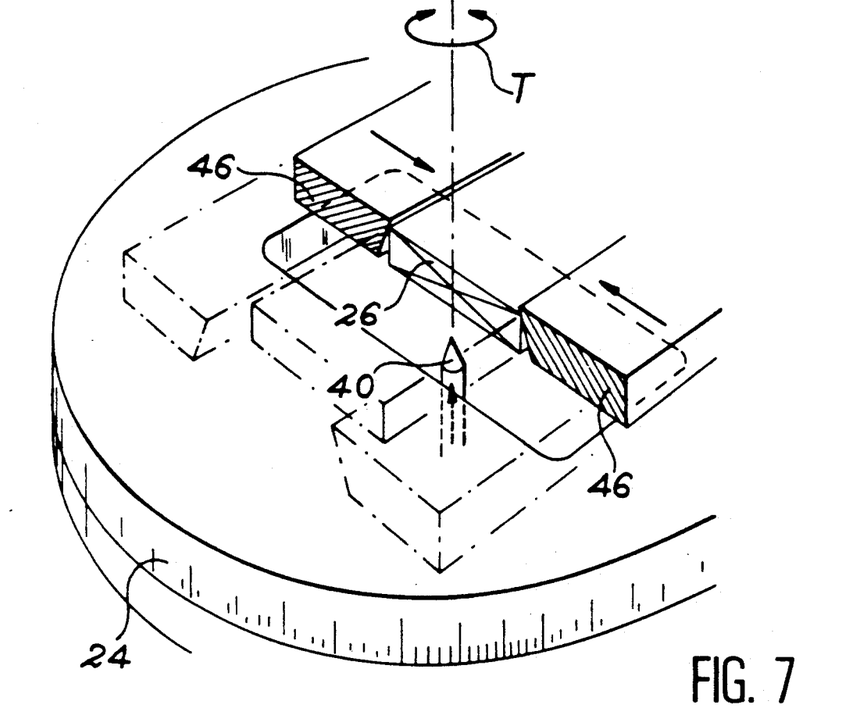
FIG. 7 is a diagrammatic view of an example of means for maintaining the plaquette in the device shown in FIG. 2.

FIG. 7 shows diagrammatically the means for maintaining sample 26 on platen 24. These are clamps 46 which maintain plaquette 26 by pressing on the ridges of latter's head face. This head face thus is not in contact with any support. In the example shown in FIG. 7, plaquette 26 is shaped as a rectangle and the bored hole of the platen is also shaped as a rectangle. Two clamps 46 are used which press respectively on two sides of the plaquette which are parallel to two sides of the bored hole. The plaquette rests through its two other sides on platen 24.

It is seen, in addition, that the clamps are provided so as to prevent the lifting of plaquette 26 during the tracing of the cleavage line on the rear face of the plaquette, the faces of the extremities of clamps 46, which bear against the ridges of the head face of the plaquette, being inclined upwards.

Figure 8:
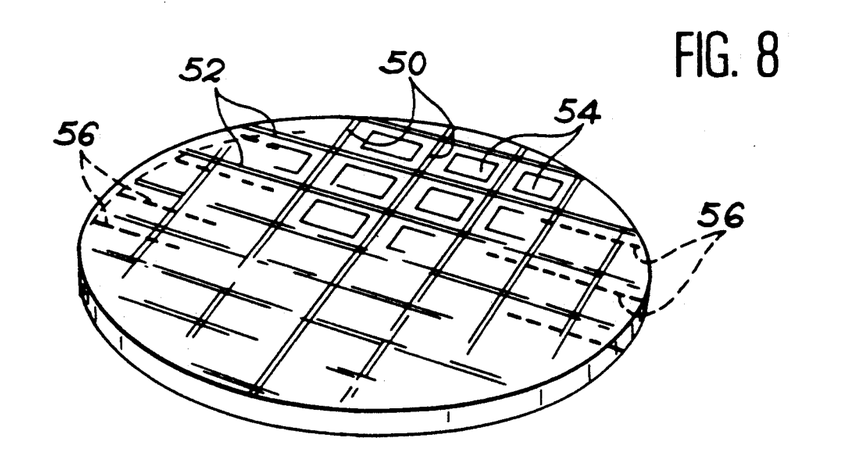
FIG. 8 illustrates diagrammatically a plaquette which comprises cleavage paths and which can be cleaved using the means shown in FIG. 6.

The way in which a plaquette is cleaved through the rear face thereof will now be explained. FIG. 8 shows diagrammatically a plaquette to be cleaved which, for example, is shaped as a circle. Cleavage paths 50 can be seen on the latter's head face which are parallel to one another. There may be other cleavage paths 52 which are parallel to one another and perpendicular to paths 50. In the areas of the plaquette's head face which are delimited by the crossings of the paths, there are semiconducting components 54 which indeed are to be separated from one another by cleavage of the plaquette along the different paths.

For this purpose, cleavage lines 56 are to be traced on the rear face of the plaquette and below the different paths.

The way in which a cleavage line is traced on the rear face of the plaquette below a cleavage path provided on the head face of that plaquette will now be explained. It should be mentioned in this respect that the elastic support described in reference to FIG. 4 and which can be used to form an impression and trace a reference direction on the head face of the plaquette is not suitable to trace the cleavage line. Therefore, if this elastic support has been used previously in association with trap 38, this assembly is dismantled and clamping means for the plaquette are set into place on platen 24, for example, of the type of those described in reference to FIG. 7.

Since an objective 28 of turret 20 is arranged along sighting axis Z, the process is started by effecting translations of platen 42 carrying diamond point 40 so that axis U of this point 40 merges with sighting axis Z, the diamond thus being located on this sighting axis.

It should be noted, in addition, that before cleaving the plaquette, the parallelism of the reticle and the future line is verified by tracing the line on a test sample and then "aligning" reticle 16 (assumed to be mobile in rotation around axis Z) on this test line.

Figure 9:
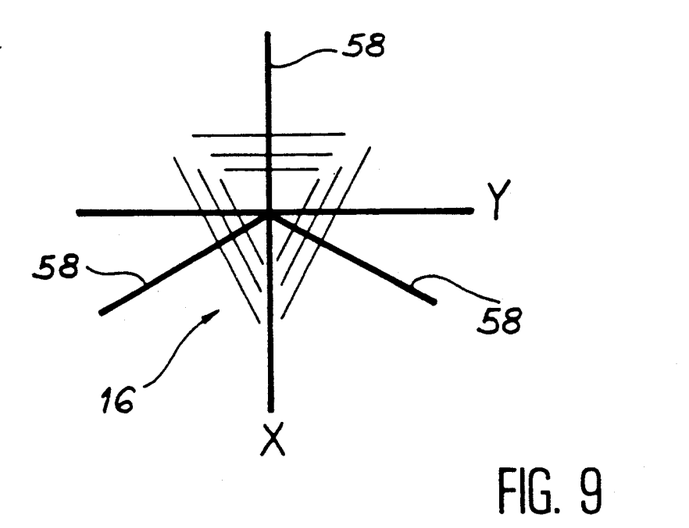
FIG. 9 illustrates diagrammatically means for locating cleavage directions which the device shown in FIG. 2 can be provided with and FIG. 10 illustrates diagrammatically a plaquette of a monocrystalline semiconducting material having a high hardness which is provided with cleavage paths and can be cleaved using the means shown in FIG. 6, in the device shown in FIG. 2.

It is possible, by the way, to provide reticle 16 with references for the marking off of a cleavage direction. In the case of the example shown in FIGS. 1A and 1B, such references can consist of three lines 58 which are at 120° with respect to one another and meet at the center of the cross of reticle 16 (for monocrystalline materials of type 111), one of the lines 58 being merged with axis X of the reticle, as can be seen in FIG. 9.

It should be specified, in addition, that the device is provided with a motion or force sensor 60 which is made rigidly integral with platen 44 (FIG. 6) and is provided to control the conditions for tracing on the plaquette. The sensitive part 62 of this sensor 60 come to bear against stage 22 when platen 44 is caused to rise, sensor 60 being set to then provide a signal which warns the user that a sufficient pressure is exerted by diamond point 40 against the rear face of the plaquette. A trap 60 can be chosen which is capable of detecting motions to the nearest ±1 micrometer.

In order to trace the cleavage line, the following procedure is used: the plaquette is set into place on platen 24 on which it is maintained by clamps 46, the rear face of the plaquette being of course against platen 24. The path along which the plaquette is to be cleaved is observed by means of objective 28 of the turret (with the knowledge that diamond point 40 is located on sighting axis Z). Using appropriate translations of stage 22 in a direction parallel to axes X and Y and an appropriate rotation of platen 24 around axis T, the path in question is oriented so that axis X of the reticle 16 is placed substantially along the median line of the path and the center of the reticle is located at one extremity of said path. Platen 44 is then raised until the diamond of point 40 exerts a sufficient pressure on the rear face of the plaquette and then the latter is moved in translation along axis X by moving stage 22 in translation along this axis X so that the cleavage line is traced along said path, the plaquette being thus cleaved. Visual control of the head face during tracing on the rear face makes it possible to stop this tracing as soon as the cleavage is seen to have occurred.

It should be noted that the performances of the device are linked to the mechanical precision of the motions parallel to axes X, Y and Z. By way of example, the device which has just been described with reference to the figures and which is adapted on a microscope makes it possible to obtain cleaved bars 150 micrometers in width starting from a CdTe bar 2.5 millimeters in width and 400 micrometers thick.

This invention makes it possible to cleave microcrystalline semiconducting materials of low hardness as well as thin layers of such materials formed on substrates which are also made of these materials and also to cleave samples of such materials in order to observe them by electron microscopy.

Because of its precision, the process according to the invention makes it possible to juxtapose integrated circuits, after cleavage, by maintaining the spacing of the active components in said circuits.

Figure 10:
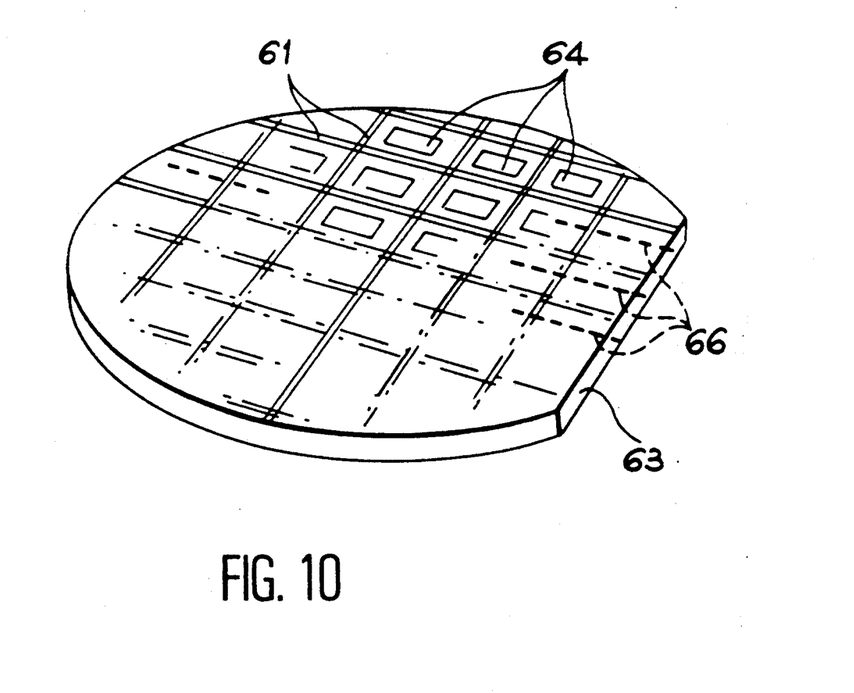

The device according to the invention also makes it possible to cleave plaquettes of monocrystalline semiconducting materials having a high hardness, such as silicon, through the rear face, with a positioning precision of several micrometers. Such a plaquette can be seen in FIG. 10 which is provided with a network of cutting paths 61 on its head face and with at least one flat part parallel to paths 61, in a known manner. Paths 61 delimit areas on which semiconducting components 64 are formed. The cleavage along one of the paths 61 is obtained by tracing, for example by means of a diamond, of a cleavage line on the rear face of the plaquette and along a line 66 located below the path under consideration, after which the plaquette is broken in two on a soft support, for example, using a roller.

I claim:

1. A device for marking off a reference direction onto a plaquette of a monocrystalline semiconducting material having a low hardness and for cleaving that plaquette, said device comprising means for forming an impression and means for forming a reference line, said means for forming an impression is provided for the formation of an impression on a face, termed head face, of the plaquette, on which face semiconducting components are, or will subsequently be, formed and in an area, termed non useful area of this head face, which area does not carry, or will not subsequently carry any of said components, the impression allowing at least one direction from which a reference direction is deduced, the means for forming the reference line traces the reference according to said reference direction, said reference direction being a direction along which the plaquette is cleaved, and means for tracing a cleavage line along said reference direction, on another face termed rear face of the plaquette and in an area of this rear face which is located below said non useful area, so as to cleave the plaquette for breaking.

2. A device according to claim 1, further comprising
   support means for supporting said plaquette, said plaquette resting on the support means through its rear face, the support means being mobile in translation along a first axis (X) and a second axis (Y) perpendicular to said first axis, said support means being, in addition, mobile in rotation around a third axis, which is perpendicular to the first and second axes and mobile in translation in a direction parallel to this third axis,
   means for maintaining the plaquette on said support means,
   microscopic means for observing the head face of the plaquette along a sighting axis (Z) which is parallel to the third axis and which has means for locating the first and second axes, said microscopic means including at least one optical microscopic observation device, and
   the means for forming a reference line traces the line when said support means are moved in translation along either one of said first and second axes.

3. A device according to claim 2, wherein said support means comprises a first support mobile in translation, along said first, second and third axes and a second support which is mobile in rotation around said third axis, which is mounted on said first support and carries said means for maintaining the plaquette.

4. A device according to claim 2 wherein said means for forming the impression and said means for forming a reference line are connected to said optical microscopic observation device to form a mobile assembly such that the optical microscopic observation device, said means for forming an impression and said means for forming a reference line are positioned alternately along the sighting axis (Z).

5. A device according to claim 2, wherein said means for tracing a cleavage line comprises a tracing member located below said support means, said tracing member is mobile in translation in directions parallel to said first (X), second (Y) and third axes, said support means includes a bored hole providing for the passage of said tracing member and said means for maintaining the plaquette prevents the lifting thereof when the tracing member presses against said plaquette.

6. A device according to claim 2, further comprising means associated with the sighting axis (Z) for locating at least one cleavage direction.

7. A device according to claim 2, wherein the means for forming the impression creates a spherically shaped impression on the plaquette.

8. A device for marking off a reference direction onto a plaquette of a monocrystalline semiconducting material having a low hardness and for cleaving that plaquette, said device comprising means for forming an impression and means for forming a reference line, said means for forming an impression is provided for the formation of an impression on the face, termed head face, of the plaquette, on which face semiconducting components are, or will subsequently, be formed and in an area, termed non useful area of this head face, which area does not carry, or will not subsequently carry any of said components, the impression allowing at least one direction from which a reference direction is deduced, the means for forming the reference line traces the reference according to said reference direction, said reference direction having a direction along which the plaquette is cleaved and means for tracing a cleavage line along said reference direction, on another face termed the rear face of the plaquette and in an area of this rear face which is located below said non useful area, so as to cleave the plaquette for breaking and further comprising:
   support means for supporting said plaquette, said plaquette resting on the support means through its rear face, these support means being mobile in translation along a first axis (X) and a second axis (Y) perpendicular to said first axis, said support means being, in addition, mobile in rotation around a third axis, which is perpendicular to the first and second axes and mobile in translation in a direction parallel to this third axis,
   means for maintaining the plaquette on said support means,
   microscopic means for observing of the head face of the plaquette along a sighting axis (Z) which is parallel to the third axis and which has means for locating the first and second axis, said microscopic means including at least one optical microscope observation device, and
   the means for forming a reference line traces the line when said support means are moved in translation along either one of said first and second axes, and wherein said means for forming an impression and said means for forming a reference line are connected to said optical observation device to define an assembly, said assembly being mobile such that the optical observation device, said means for forming an impression and said means for forming a reference line are positioned alternately along the sighting axis (Z), and wherein said means for tracing a cleavage line comprises a tracing member located below said support means and which is mobile in translation in directions parallel to said first (X), second (Y) and third axes, said support means includes a bored hole providing for the passage of said tracing member and said means for maintaining the plaquette prevents the lifting thereof when the tracing member passes against said plaquette.

* * * * *